(12) United States Patent
Hiura

(10) Patent No.: US 6,236,093 B1
(45) Date of Patent: May 22, 2001

(54) SEMICONDUCTOR DEVICE INCLUDING GATE ELECTRODE HAVING POLYMETAL STRUCTURE AND METHOD OF MANUFACTURING OF THE SAME

(75) Inventor: Yohei Hiura, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/151,657

(22) Filed: Sep. 11, 1998

(30) Foreign Application Priority Data

Sep. 11, 1997 (JP) .................................................... 9-245862

(51) Int. Cl.$^7$ .................................................... H01L 29/76
(52) U.S. Cl. .................................................... 257/413; 257/900
(58) Field of Search .................................................... 257/413, 900, 257/915, 408

(56) References Cited

U.S. PATENT DOCUMENTS 4,258,465 * 3/1981 Yasui et al. ............................ 257/408
5,796,151 * 8/1998 Hsu et al. ............................ 257/410
5,796,166 * 8/1998 Agnello et al. ............................ 257/413
5,925,918 * 7/1999 Wu et al. ............................ 257/413

FOREIGN PATENT DOCUMENTS 7-183513 7/1995 (JP).

* cited by examiner

Primary Examiner—Mark V. Prenty
(74) Attorney, Agent, or Firm—Pillsbury Winthrop LLP

(57) ABSTRACT

According to the present invention, a gate electrode having a polymetal structure, that is, a lamination structure of a polysilicon film formed via a gate insulating film on a semiconductor substrate, and a refractory metal film. An electroconductive side wall made of tungsten silicide or the like is formed on a side surface of the refractory metal film which constitutes the gate electrode. The side wall serves to prevent the evaporation of the refractory metal film.

8 Claims, 7 Drawing Sheets

US 6,236,093 B1

SEMICONDUCTOR DEVICE INCLUDING GATE ELECTRODE HAVING POLYMETAL STRUCTURE AND METHOD OF MANUFACTURING OF THE SAME

BACKGROUND OF THE INVENTION

The present invention relates to a method of manufacturing a gate electrode in which, for example, a refractory metal film and a polysilicon film are used, and more specifically, to a method of manufacturing a semiconductor device including a gate electrode having a polymetal structure, which is a laminate structure of W/WNxSi/Poly-Si or the like.

The performance of MOS LSIs is becoming higher as the gate length of the MOS FETs is reduced. With the reduction of the gate length, the delay of a signal (called "propagation delay" ) when it is transmitted in the gate width direction is becoming impossible to neglect. In order to suppress the propagation delay, it is necessary to use a gate electrode of a low resistance. In general, a gate electrode employs a polycide gate structure in which a refractory metal silicide film such as tungsten silicide film is laminated on a polysilicon film. However, it is presently considered to use the polymetal gate structure, since it can lower the resistance value than the polycide gate structure does. The polymetal gate structure has a structure in which a refractory metal film such as of tungsten, which has a specific resistance smaller than that of a refractory metal silicide film by one digit, is laminated on a polysilicon film.

FIGS. 1 to 4 illustrates the first prior art example. The first prior art example is an cross sectional structure of a general polymetal gate electrode. In FIG. 4, a polymetal gate electrode containing a polysilicon film (the lower portion of the gate electrode) 3, a first tungsten nitride film 16 and a tungsten film (the upper portion of the gate electrode) 5a, is formed via a gate insulating film (a gate oxide film) 2 on a P-type semiconductor substrate 1.

As discussed in Jpn. Pat. Appln. KOKAI Publication No. 7-183513, a thermal oxidation, which is so called post oxidation, is carried out in the conventional method of manufacturing a MOS transistor. In the post oxidation, after the formation of the gate electrode by RIE (reactive ion etching), the polysilicon film and gate insulating film are thermally oxidated. By the post oxidation, the damage caused to the gate insulating film due to the etching can be recovered. Together with this, the lower end portion of the gate electrode is oxidated by the post oxidation to be rounded. Due to the rounded shape, when a voltage is applied to the gate, the concentration of the electrical field at the gate end portion is reduced. Therefore, the reliability of the gate insulating film at the end portion of the gate electrode is improved.

A method of manufacturing a semiconductor device which uses a polymetal gate electrode, according to the first prior art example, will now be described with reference to FIGS. 1 to 4.

As can be seen in FIG. 1, a gate insulating film 2 is formed on a semiconductor substrate 1 by thermal oxidation. Subsequently, a polysilicon film (the lower portion of a gate electrode) 3, a first tungsten nitride 16 and a tungsten film (gate electrode) 5a are deposited in this order. The first tungsten nitride film 16 serves as a reaction inhibiting film for inhibiting the reaction between the tungsten film 5a and the polysilicon film 3. Then, a first silicon nitride film 6 is deposited on the tungsten film 5a. Next, as shown in FIG. 2, the first silicon nitride film 6 is etched using a resist, though not shown, as a mask. Further, with use of the first polysilicon nitride film 6 as a mask, the tungsten film 5a, the first tungsten nitride film 16 and the polysilicon film 3 are etched, thus forming a gate electrode. Subsequently, as shown in FIG. 3, a round portion 8 is formed at the lower end section of the polysilicon film 3 by carrying out the post-oxidation step. Next, ion implantation is carried out while using the gate electrode as a mask, and thus N-type source/drain regions 9 are formed in the substrate 1. Next, as shown in FIG. 4, an interlayer insulating film 10 is formed on an entire surface, and a contact hole 11 is formed in the interlayer insulating film 10 and the first silicon nitride film 6. In the contact hole 11, a wiring layer 12 made of a metal is formed.

In the post oxidation step, the tungsten film 5a, when oxidated, expands its volume, and the shape of the gate becomes abnormal. Therefore, in this step, it is required to selectively oxidate the polysilicon film 3 only. More specifically, by controlling the partial pressures and flow amounts of $H_2O$ and $H_2$, the oxidation is carried out in an atmosphere which is controlled to oxidate only silicon. At the same time, however, a portion of the tungsten film 5a evaporates. Further, depending upon the oxidation condition, the side wall of the tungsten film 5a may retreat backwards significantly, and in some cases, the film becomes narrowed by 10 nm or more on one side. As described, in the first prior art example, the oxidation of the tungsten film is avoided as much as possible by controlling the atmosphere of the post oxidation step. However, in the post oxidation step, the oxidation atmosphere is controlled, and therefore a control device, which is very costly, is required. Further, a portion of the tungsten film 5a is evaporated so that the tungsten film 5a becomes slender, and such a technique may becomes a factor of increasing the wiring resistance. Further, when evaporated tungsten film attaches to the substrate, the contamination of metal occurs, thus increasing the junction leakage. As a result, the deterioration of a property such as the data retention performance of the memory cell occurs.

FIGS. 5 to 10 illustrate the second prior art example. The second prior art example is discussed in Jpn. Pat. Appln. KOKAI Publication No. 7-183513. The second prior art example is not a technique involving a polymetal gate structure as in the first prior art example, but an invention regarding a gate electrode having a so-called polycide structure in which a refractory metal silicide film is used as the upper electrode member of the gate electrode. In addition, the second prior art example discloses not a technique of avoiding the evaporation of the gate electrode member, but a technique of inhibiting the oxidation thereof. More specifically, as shown in FIG. 10, the second silicon nitride film 13 is formed on a side wall of the refractory metal silicide film (the upper portion of the gate electrode) 5b, and with this structure, the oxidation of the refractory metal silicide film 5b is suppressed.

The manufacture method according to the second prior art example will now be described with reference to FIGS. 5 to 10. As shown in FIG. 5, the method includes a step of depositing not a tungsten film, but a tungsten silicide film 5b as the upper portion of the gate electrode. The other processing steps are similar to those of the first prior art example. A gate insulating film 2 is formed on a substrate 1. On the gate insulating film 2, a polysilicon film (the lower portion of the gate electrode) 3, a tungsten silicide film (the upper portion of the gate electrode) 5b and a first silicon nitride film 6 are formed in the order. Then, a natural oxide film 4 is created between the polysilicon film 3 and the tungsten silicide film 5b. Subsequently, as shown in FIG. 6, the first silicon nitride film 6, the tungsten silicide film 5b and the natural oxide film 4 are etched. In this etching, the polysilicon film 3 is left without being etched. Next, as shown in FIG. 7, a second silicon nitride film 13 is deposited on the entire surface. Then, as shown in FIG. 8, the second silicon nitride film 13 is etched back by RIE, and thus the second silicon nitride film 13 remains on side walls of the first silicon nitride film 6 and the tungsten silicide film 5b. Further, the polysilicon film 3 is etched using a side wall made of the second silicon nitride film 13 as a mask. Next, as shown in FIG. 9, with the post oxidation, that is, a heat treatment, the damage caused by the etching is recovered and a round portion 8 is formed at the lower end portion of the polysilicon film 3. Next, source/drain regions 9 are formed within the substrate 1 by ion implantation. Next, as shown in FIG. 10, the entire surface of coated with an interlayer insulation film 10 and a contact hole 11 is formed in the interlayer insulation film 10 and the first silicon nitride film 6. Next, a metal film is deposited on the entire surface, and then lithography and etching are carried out to form a wiring layer 12.

In the second prior art example, the second silicon nitride film 13 is formed on a side wall of the tungsten silicide film 5b. With this structure, it is possible to prevent, in the post oxidation step, the oxidation of the tungsten silicide film 5b which constitutes the upper portion of the gate electrode. Therefore, an increase in the wiring resistance can be suppressed. However, the second silicon nitride film 13 formed on the side wall of the tungsten silicide film 5b, and does not serve as a gate electrode. Consequently, the region of the gate electrode is increased by the region of the side wall. In other words, the area of the memory cell portion increases, and therefore further downsizing of the device is prevented.

BRIEF SUMMARY OF THE INVENTION

The object of the present invention is to provide a method of manufacturing a semiconductor device, which is capable of performing a post oxidation without causing an increase in the wiring resistance or enlarging the region of the memory cell portion.

The object of the present invention can be achieved by the following method.

That is, a method of manufacturing a semiconductor device, comprising the steps of: forming a gate electrode having a lower layer made of a polysilicon film and an upper layer made of a refractory metal film; covering a side surface of the refractory metal film with a tungsten silicide film; and oxidating a side surface of the polysilicon film by thermal oxidation after the covering step.

The object of the present invention can be achieved the following method.

That is, a method of manufacturing a semiconductor device, comprising the steps of: forming a gate insulating film on a semiconductor substrate; depositing a polysilicon film on the gate insulating film; depositing a refractory metal film on the polysilicon film; depositing a silicon nitride film on the refractory metal film; forming an upper portion of a gate electrode by selectively etching the silicon nitride film and the refractory metal film; depositing a tungsten silicide film on an entire surface; removing the tungsten silicide film such that a portion thereof remains at least on a side wall of the refractory metal film; forming a lower portion of the gate electrode, which is made of the refractory metal film and the polysilicon film, by selectively etching the polysilicon film using the tungsten silicide film formed by the removing step, as a mask; and forming an oxide film on a side surface of the polysilicon film by oxidating the polysilicon film.

According to the present invention, there is also provided a semiconductor device comprising: a polysilicon film to serve as an lower portion of a gate electrode, provided via a gate insulating film on a semiconductor substrate; a refractory metal film to serve as an upper portion of the gate electrode, a provided on the polysilicon film; a silicon nitride film provided on the refractory metal film; an oxidation inhibiting film having a conductivity and provided on a side surface of the refractory metal film; and source/drain regions provided in the semiconductor substrate.

In the present invention, a side wall made of an oxidation inhibiting film having a conductivity, such as tungsten silicide, is formed on a side surface of the gate electrode member. With this structure, the evaporation of the tungsten film can be prevented during the oxidation step, and an increase in the wiring resistance of the gate. Further, the deterioration of the data retention performance, which is caused by the metal contamination, can be prevented. In addition, since the side wall having a conductivity is used, and therefore the side wall serves as a part of the gate electrode. Consequently, an increase in the area of the memory cell, which may occur in order to obtain a pre-required wiring resistance, can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The first embodiment of the present invention will now be described with reference to FIGS. 11 to 16.

Figure 16:
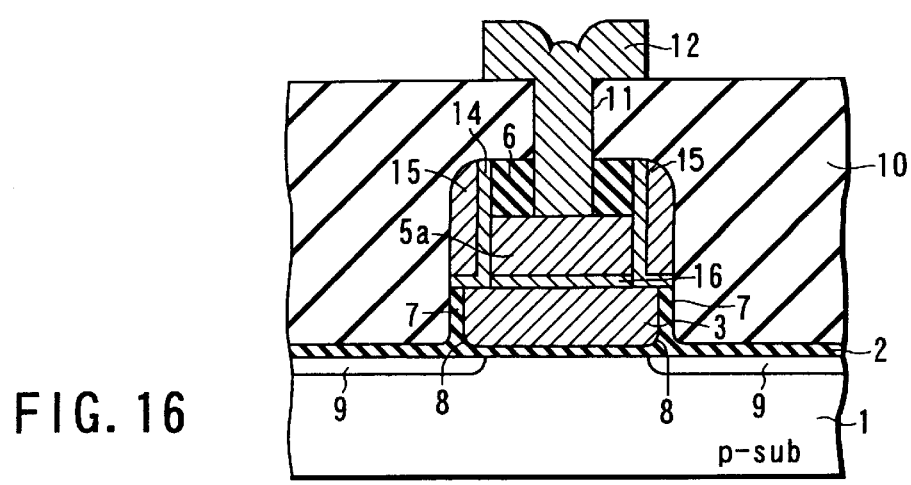
FIG. 16 is a cross sectional view illustrating a step which follows the one shown in FIG. 15.

FIG. 16 is a cross sectional view showing a gate structure of a semiconductor device according to the first embodiment of the present invention. As shown in this figure, a polymetal gate (W/wNxSi/Poly-Si) made of a polysilicon film (the lower portion of the gate electrode) 3 and a tungsten film (the upper portion of the gate electrode) 5a is formed via a gate insulating film 2 on a P-type semiconductor substrate 1, and a source/drain region 9 is formed on both sides of the gate in the semiconductor substrate 1. The following is a difference between the first embodiment of the present invention and the second prior art example. That is, in the second prior art example, a silicon nitride film is formed on a side wall of the upper section of the gate electrode, whereas in the first embodiment of the present invention, a side wall made of the second tungsten nitride film 14 and the first tungsten silicide film 15 is formed. The second tungsten nitride film 14 is provided for the purpose of preventing the reaction between the tungsten film 5a and the first tungsten silicide film 15. The second tungsten nitride film 14 is not essential.

The method of manufacturing a semiconductor device, according to the first embodiment, will now be described with reference to FIGS. 11 to 16.

Figure 1:
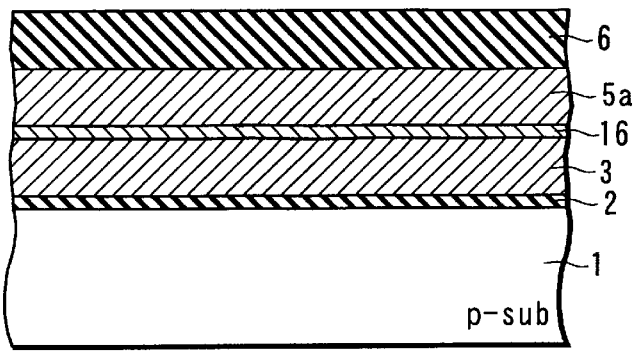
FIG. 1 is a cross sectional view illustrating a step of a method of manufacturing a semiconductor device, according to the first prior art example.
Figure 2:
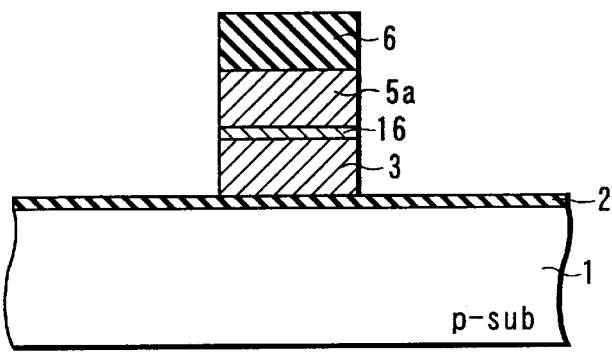
FIG. 2 is a cross sectional view illustrating a step which follows the one shown in FIG. 1.
Figure 3:
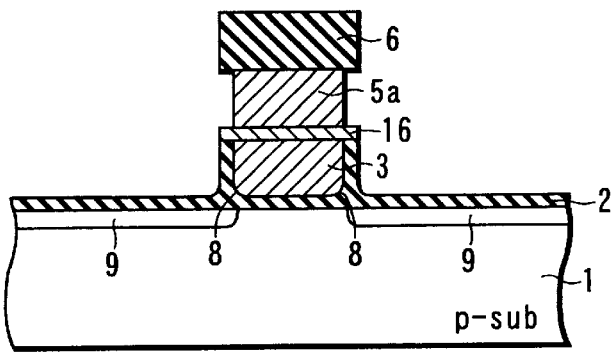
FIG. 3 is a cross sectional view illustrating a step which follows the one shown in FIG. 2.
Figure 4:
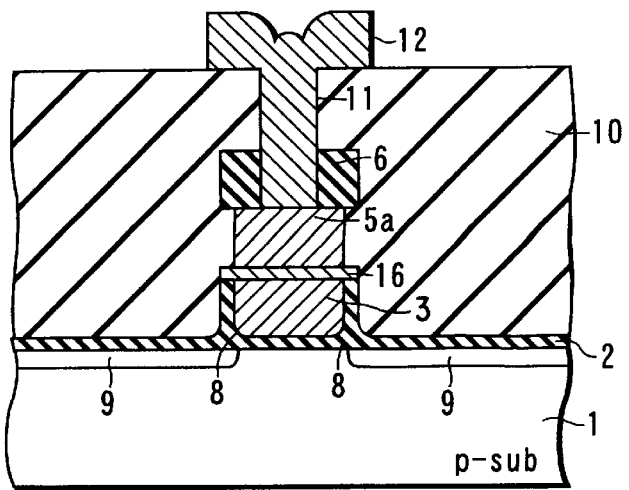
FIG. 4 is a cross sectional view illustrating a step which follows the one shown in FIG. 3.
Figure 5:
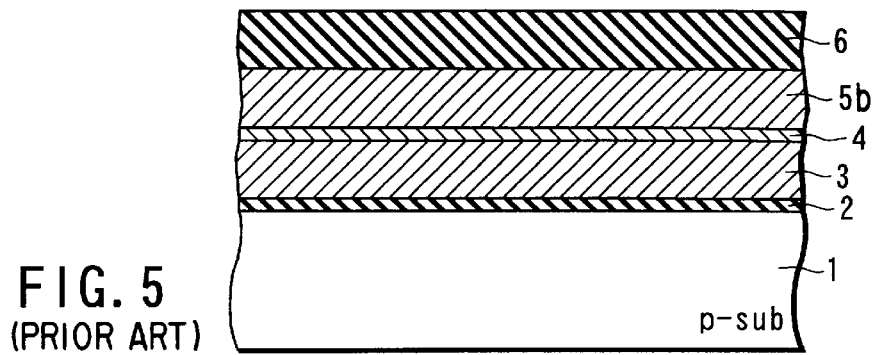
FIG. 5 is a cross sectional view illustrating a step of a method of manufacturing a semiconductor device, according to the second prior art example.
Figure 6:
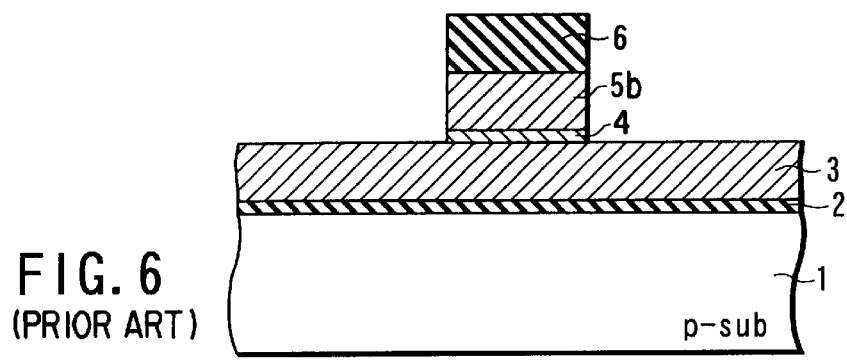
FIG. 6 is a cross sectional view illustrating a step which follows the one shown in FIG. 5.
Figure 7:
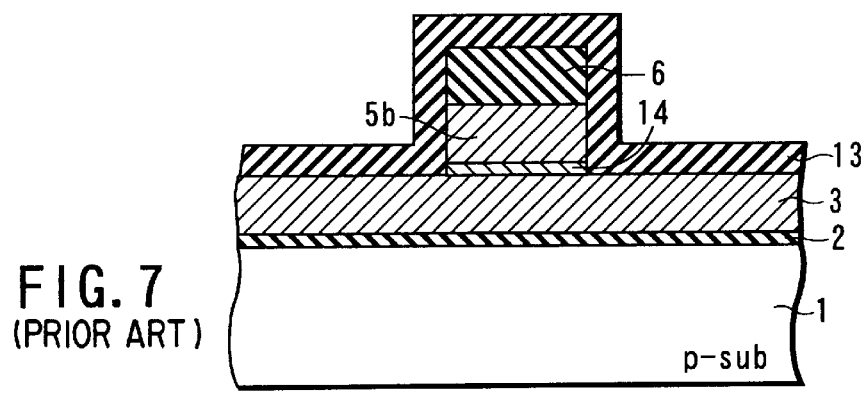
FIG. 7 is a cross sectional view illustrating a step which follows the one shown in FIG. 6.
Figure 8:
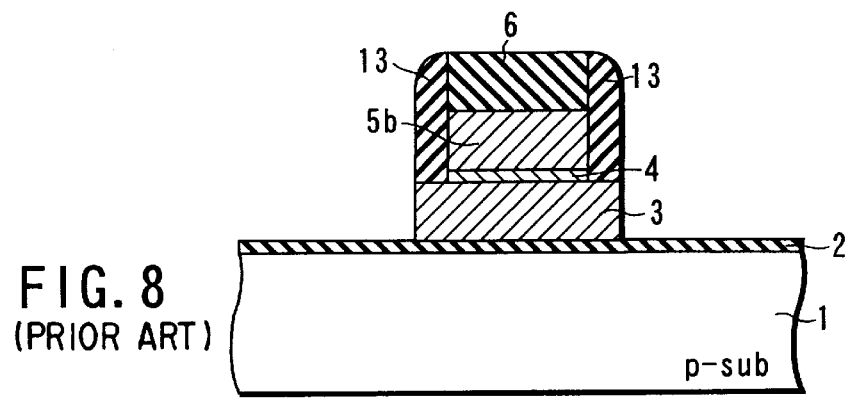
FIG. 8 is a cross sectional view illustrating a step which follows the one shown in FIG. 7.
Figure 9:
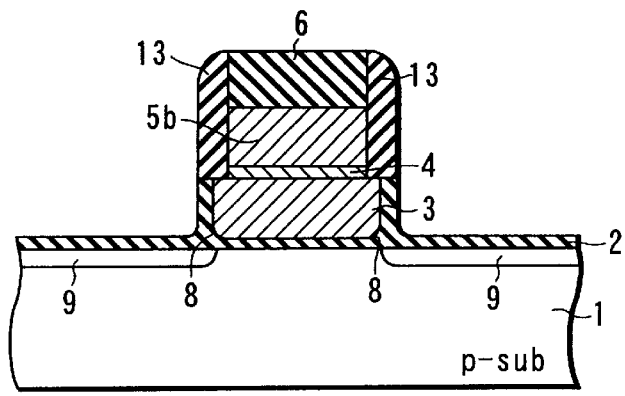
FIG. 9 is a cross sectional view illustrating a step which follows the one shown in FIG. 8.
Figure 10:
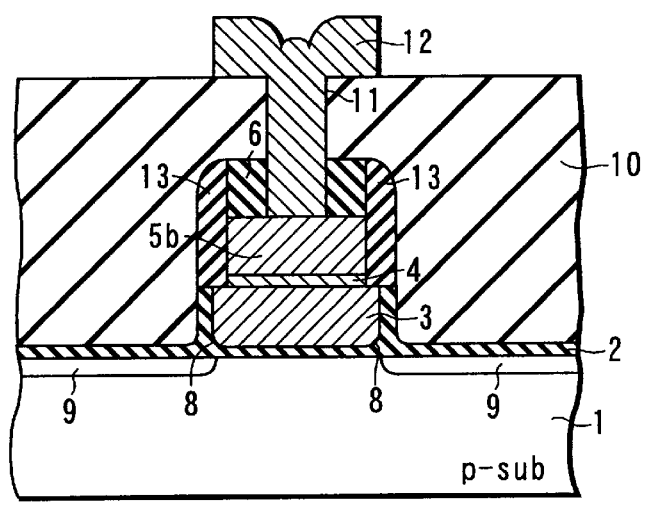
FIG. 10 is a cross sectional view illustrating a step which follows the one shown in FIG. 9.
Figure 11:
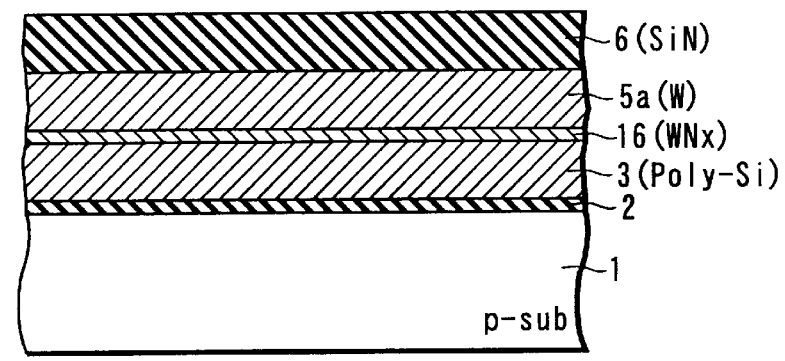
FIG. 11 is a cross sectional view illustrating a step of a method of manufacturing a semiconductor device, according to the first embodiment of the present invention.
Figure 12:
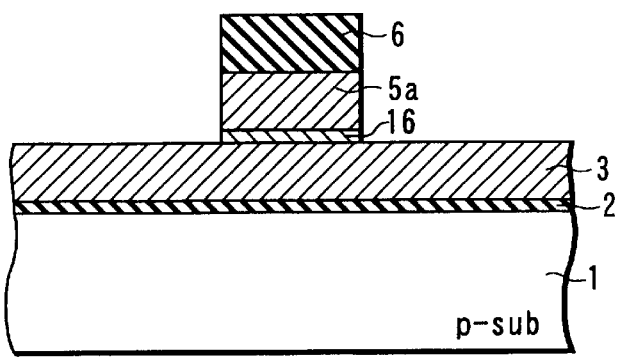
FIG. 12 is a cross sectional view illustrating a step which follows the one shown in FIG. 11.
Figure 13:
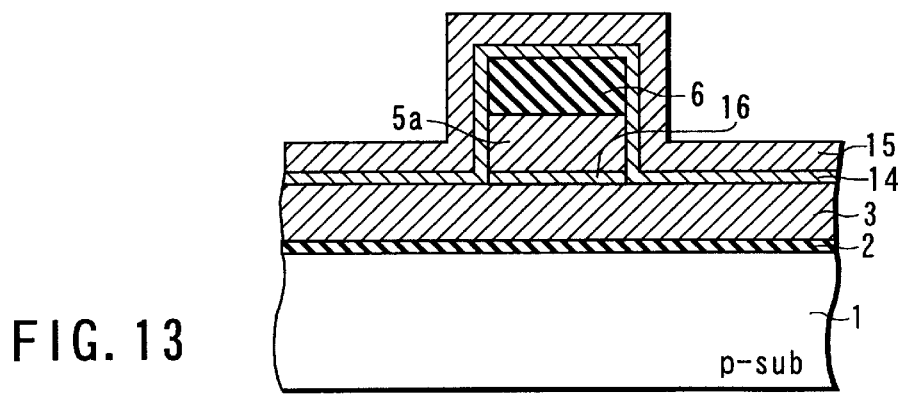
FIG. 13 is a cross sectional view illustrating a step which follows the one shown in FIG. 12.
Figure 14:
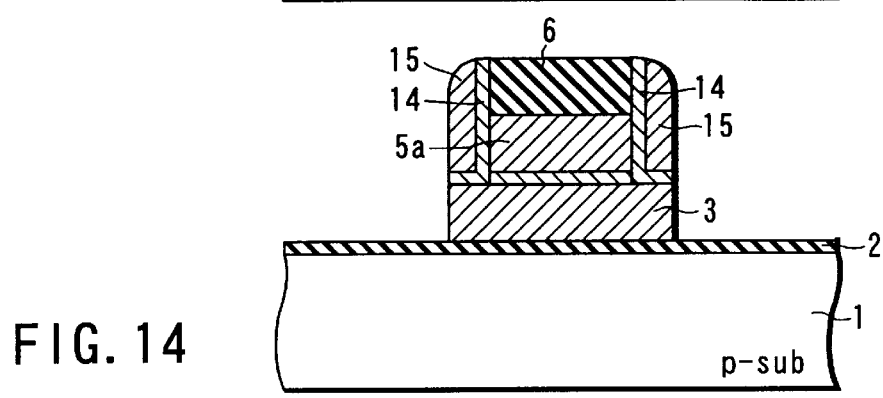
FIG. 14 is a cross sectional view illustrating a step which follows the one shown in FIG. 13.

As shown in FIG. 11, a gate insulating film 2 having a thickness of about 4 nm is formed on a P-type semiconductor substrate 1 by thermal oxidation. Next, a polysilicon film (the lower portion of the gate electrode) having a thickness of about 100 nm is deposited by a CVD method. Subsequently, a first tungsten nitride film having a thickness of 5 nm and a tungsten film (the upper portion of the gate electrode) having a thickness of about 100 nm are deposited in the order by a sputtering method. It should be noted that the first tungsten nitride film 16 (WNx) deposited to have a thickness of about 5 nm becomes WSiNx having a thickness of about 1 nm after the reaction. Then, a first silicon nitride film 6 is deposited on the tungsten film 5a by the CVD method. Next, as shown in FIG. 12, the first silicon nitride film 6 is etched using a resist (not shown) as a mask. Then, using the first silicon nitride film 6 as a mask, the tungsten film 5a and the first tungsten nitride film 16 are etched, thus forming the upper portion of the gate electrode. After that, as shown in FIG. 13, a second tungsten nitride film 14 having a thickness of, for example, about 5 nm and a first tungsten silicide film 15 having a thickness of, about 10 nm, are deposited on the entire surface in the order by the sputtering method or CVD. Next, as shown in FIG. 14, the first tungsten silicide film 15 and the second tungsten nitride 14 are etched back by RIE, and thus a side wall made of a second tungsten film 14 and a first tungsten silicide film 15 is formed on a side surface of the gate electrode. Then, using the side wall as a mask, the polysilicon film 3 is etched by RIE, and thus the lower portion of the gate electrode is formed.

Figure 15:
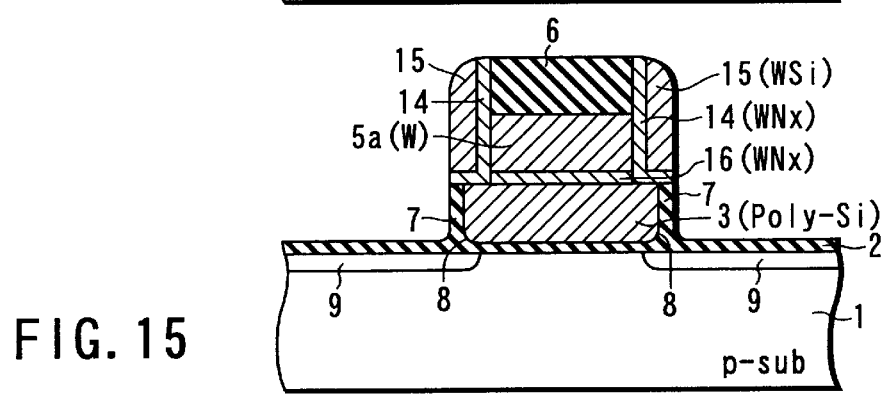
FIG. 15 is a cross sectional view illustrating a step which follows the one shown in FIG. 14.

After a while, as shown in FIG. 15, a thermal oxidation which is called post-oxidization, is carried out, in order to recover the damage caused by the etching. At the same time, an oxide film 7 is formed on the side surface of the polysilicon film 3, and a round portion 8 is formed at the lower end portion of the polysilicon film 3. After that, N-type source/drain regions 9 are formed within the substrate 1 by ion implantation. Then, as shown in FIG. 16, an interlayer insulating film 10 is deposited on the entire surface. A contact hole 11 is made in the interlayer insulating film 10 and the first silicon nitride film 6. Next, a metal film is deposited on the entire surface, and a wiring layer 12 connected to the gate electrode is formed by lithography and etching.

According to the first embodiment, the side wall made of the second tungsten nitride film 14 and the first tungsten silicide film 15 is formed on the side surface of the tungsten film 5a. With this structure, after forming the gate electrode by RIE, the evaporation of the tungsten film can be prevented in the post oxidation step. Further, since the evaporation of the tungsten film can be prevented, tungsten being attached to the substrate can be avoided. Therefore, an increase in the junction leakage can be inhibited, and the deterioration of the device performance can be prevented. Further, in this embodiment, the oxidation of tungsten can be prevented, and therefore as mentioned before in connection with the first prior art example, there is no need to control the partial pressures and flow amounts of $H_2O$ and $H_2$. Consequently, the production cost can be reduced. Note that it is possible to use oxygen atmosphere for the post oxidation process.

Further, the second tungsten nitride film 14 and the first tungsten silicide film 15 which are formed on the side surface of the tungsten film 5a, each have a conductivity. Consequently, the second tungsten nitride film 14 and the first tungsten silicide film 15 serve as a part of the gate electrode. Therefore, the wiring resistance can be reduced without increasing the width of the gate electrode.

With regard to the suppression of an increase in the wiring resistance, the difference between the prior art technique and the present invention will now be specifically described. In the first prior art example, the rate of increasing the resistance can be expressed by $A/(L-A)$ [A: width of the gate narrowed by the evaporation, L: width of the gate before the evaporation]. By contrast, in the first embodiment, an electro-conductive evaporation preventing film made of the second tungsten film 14 and the first tungsten silicide film 15 is used, and therefore the tungsten film is prevented from being evaporated and narrowed. Thus, the increase in the wiring resistance of the gate electrode can be suppressed.

As described above, in the first prior art example, the rate of increasing the resistance is A/(L−A). By contrast, in the second prior art example, the increase in the wiring resistance is suppressed; however the second silicon nitride film 13 formed on the side wall of gate does not serve as a gate electrode. Therefore, the gate region is increased and the area of the memory cell portion is increased, thus blocking the further downsizing of the device. On the other hand, in the first embodiment, the side wall made of the second tungsten nitride film 14 and the first tungsten silicide film 15, which are formed on the side surface of the gate, serves as a part of the gate electrode. Therefore, if the gate width and the aspect ratio of the gate are the same as those of the second prior art example, the first embodiment can reduce the wiring resistance of the gate further as compared to the second prior art example. In other words, if the gate width and the wiring resistance of the gate of the first embodiment are the same as those of the second prior art example, the first embodiment can downsize the element further as compared to the second prior art example.

Further, if the gate width and the aspect ratio of the gate are the same as those of the second prior art example, it becomes possible to use a tungsten film thinner than that of the second prior art example. Consequently, the aspect ration of the gate can be lowered than that of the second prior art example. Thus, the difference in level on the semiconductor substrate can be reduced, and therefore the flattening process, which is later carried out, can be facilitated.

The second embodiment of the present invention will now be described with reference to FIGS. 17 to 22.

Figure 22:
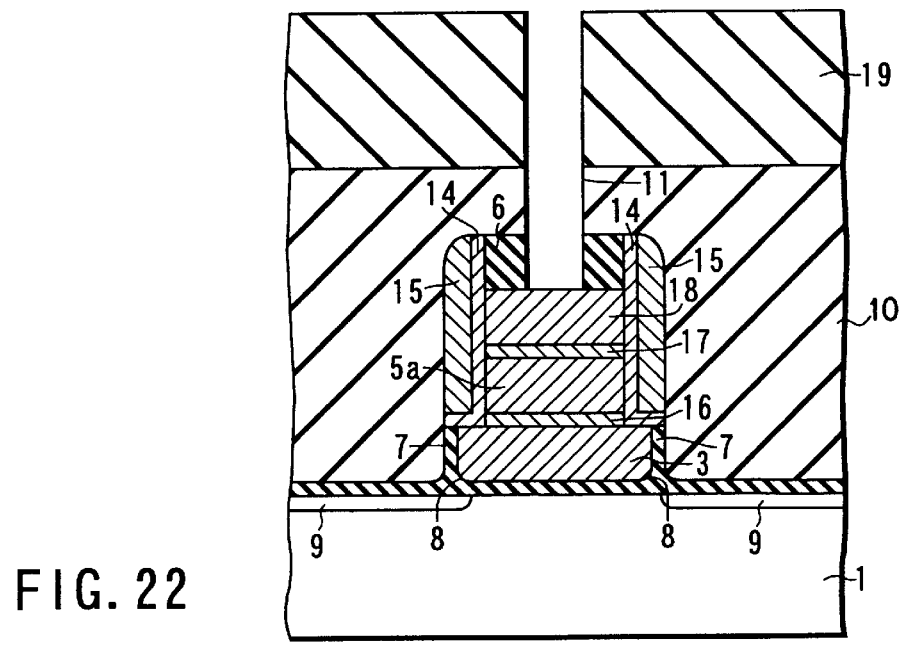
FIG. 22 is a cross sectional view illustrating a step which follows the one shown in FIG. 21.

FIG. 22 is a cross sectional view showing the gate structure of a semiconductor device according to the second embodiment of the present invention. As shown in this figure, a polymetal gate made of a polysilicon film (the lower portion of the gate electrode) 3 and a tungsten film (the upper portion of the gate electrode) 5a is formed via a gate insulating film 2 on a P-type semiconductor substrate 1, and source/drain regions 9 are formed both sides of the gate within the semiconductor substrate 1. The following is a difference between the first and second embodiments of the present invention. That is, in the second embodiment, a third tungsten nitride 17 and a second tungsten silicide film 18 are provided between the tungsten film (the upper portion of the gate electrode) 5a and the first silicon nitride film 6. The second tungsten silicide film 18 serves to protect the tungsten film 5a from the process carried out with a mixture solution of hydrogen peroxide solution and sulfuric acid, which is co-used in an ashing process, in the resist removing step after opening the contact hole 11 in the first silicon nitride film 6, which will be explained later. With the second tungsten silicide film 18, it becomes possible to carry out a process with a mixture solution of hydrogen peroxide solution and sulfuric acid, in addition to the ashing process, and therefore the resist can be taken off even more surely. Further, the first tungsten nitride film 16 has the function of inhibiting the reaction between the polysilicon film 3 and the tungsten film 5a, and the third tungsten nitride film 17 has the function of inhibiting the reaction between the tungsten film 5a and the second tungsten silicide film 18.

The method of manufacturing a semiconductor device, according to the first embodiment, will now be described with reference to FIGS. 17 to 22.

Figure 17:
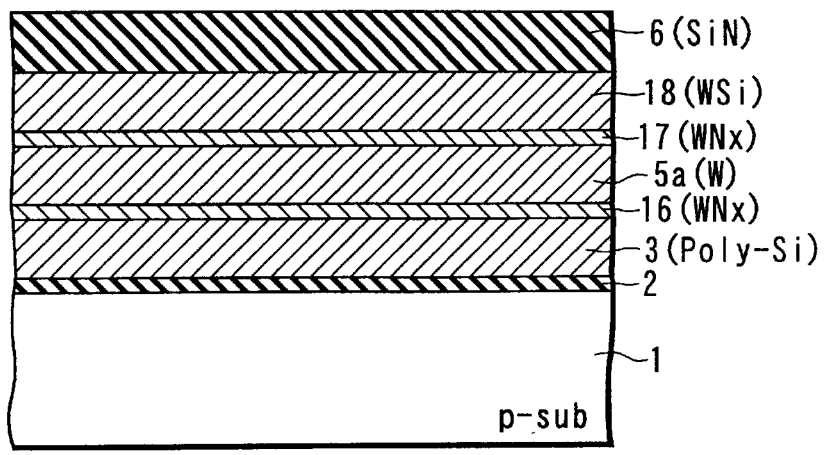
FIG. 17 is a cross sectional view illustrating a step of a method of manufacturing a semiconductor device, according to the second embodiment of the present invention.
Figure 18:
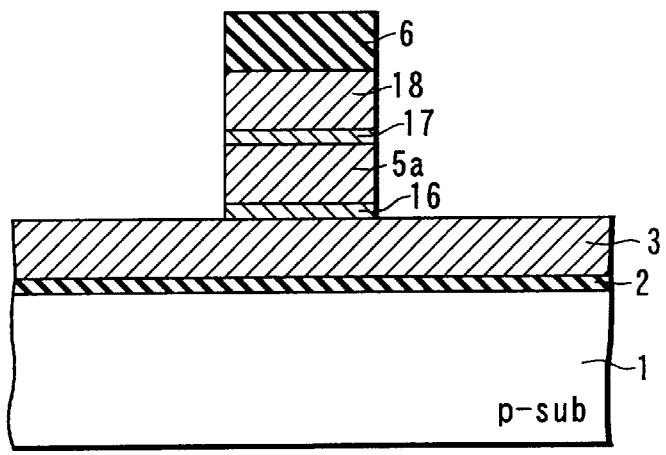
FIG. 18 is a cross sectional view illustrating a step which follows the one shown in FIG. 17.

As shown in FIG. 17, a gate insulating film 2 having a thickness of about 40 nm is formed on a P-type semiconductor substrate 1 by thermal oxidation. Next, a polysilicon film (the lower portion of the gate electrode) having a thickness of about 100 nm is deposited on the gate insulating film 2 by a CVD method. Subsequently, a first tungsten nitride film 16 having a of 5 nm, a tungsten film 5a having a thickness of about 40 nm, a third tungsten nitride film 17 having a thickness of about 5 nm and a second tungsten silicide film 18 having a thickness of about 100 nm, are deposited on the polysilicon film 3 in the order by, for example, a sputtering method. Then, a first silicon nitride film 6 is deposited on the second tungsten silicide film 18 by the CVD method. Next, as shown in FIG. 18, the first silicon nitride film 6 is etched using a resist (not shown) as a mask. Then, using the first silicon nitride film 6 as a mask, the second tungsten silicide film 18, the third tungsten nitride film 17, the tungsten film 5a and the first tungsten nitride film 16 are etched, thus forming the upper portion of the gate electrode as shown in FIG. 18.

Figure 19:
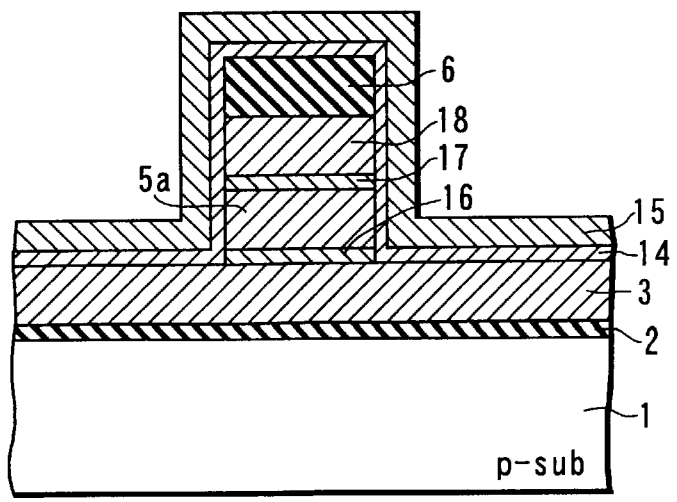
FIG. 19 is a cross sectional view illustrating a step which follows the one shown in FIG. 18.
Figure 20:
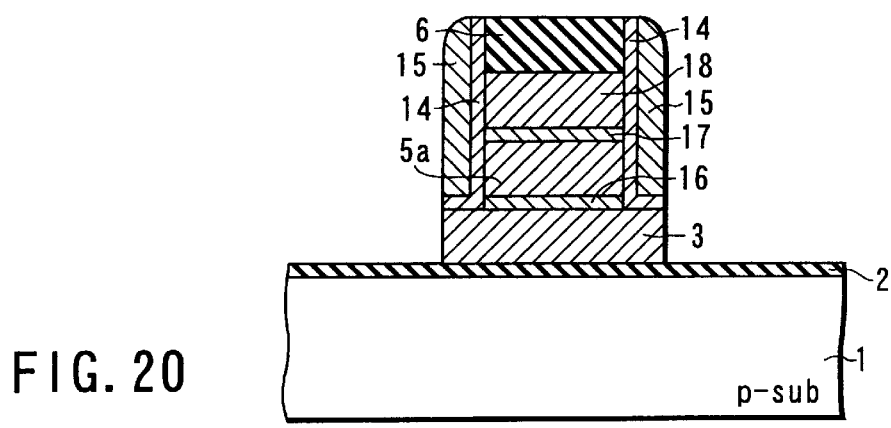
FIG. 20 is a cross sectional view illustrating a step which follows the one shown in FIG. 19.

After that, as shown in FIG. 19, a second tungsten nitride film 14 having a thickness of, for example, about 5 nm and a first tungsten silicide film 15 having a thickness of, about 10 nm, are deposited on the entire surface in the order by the sputtering method. Next, as shown in FIG. 20, the first tungsten silicide film 15 and the second tungsten nitride 14 are etched back by RIE, and thus a side wall made of the second tungsten film 14 and the first tungsten silicide film 15 is formed on a side surface of the gate electrode. Then, using the side wall as a mask, the polysilicon film 3 is etched by RIE, and thus the lower portion of the gate electrode is formed.

Figure 21:
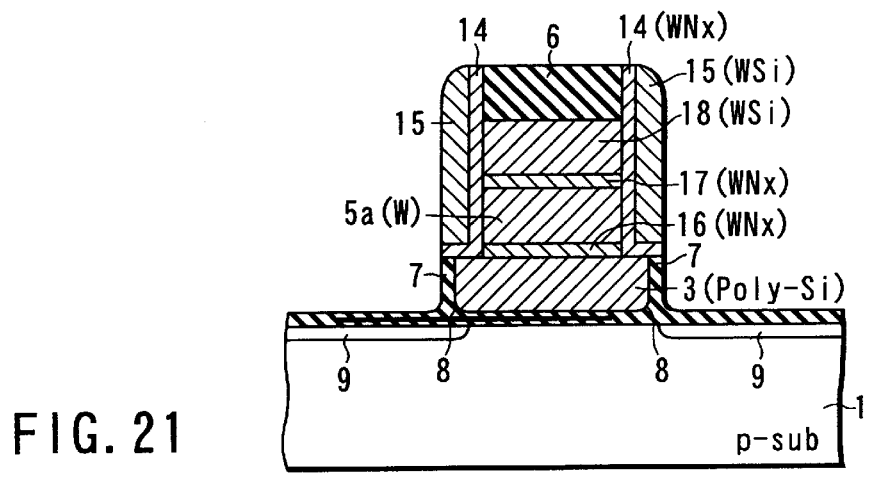
FIG. 21 is a cross sectional view illustrating a step which follows the one shown in FIG. 20.

After a while, as shown in FIG. 21, a thermal oxidation which is called post-oxidization, is carried out, in order to recover the damage caused by the etching, as so in the first embodiment. At the same time, an oxide film 7 is formed on the side surface of the polysilicon film 3, and a round portion 8 is formed at the lower end portion of the polysilicon film 3. After that, an N-type source/drain region 9 is formed within the substrate 1 by ion implantation.

Figure 23:
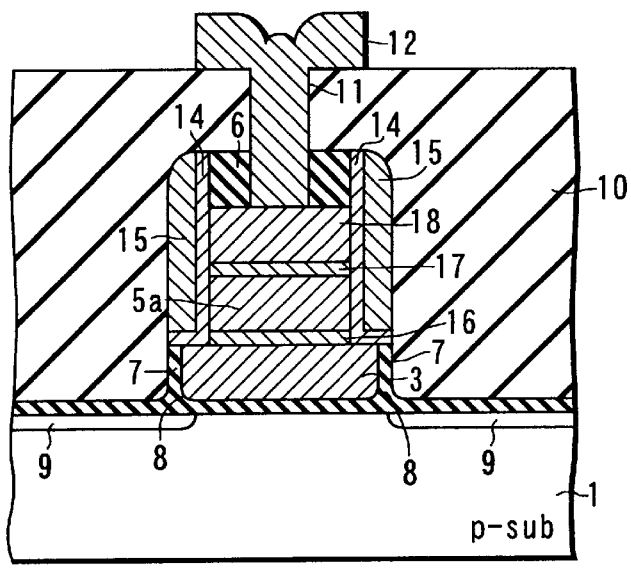
FIG. 23 is a cross sectional view illustrating a step which follows the one shown in FIG. 22.

Next, as shown in FIG. 22, an interlayer insulating film 10 is deposited on the entire surface, and then a resist film 19 is formed on the interlayer insulating film 10 for patterning. Using the resist film 19 as a mask, the interlayer insulating film 10 and the silicon nitride film 6 are etched, and further a contact hole 11 is made in these films. After that, the resist film 19 is removed by the ashing process and another process using a mixture solution of hydrogen peroxide solution and sulfuric acid. Next, a metal film is deposited on the entire surface, and a wiring layer 12 connected to the second tungsten silicide is formed by lithography and etching as shown in FIG. 23.

According to the second embodiment, a similar effect to that of the first embodiment can be obtained. Further, the second tungsten silicide film 18 is formed underneath the first silicon nitride film 6, so as to protect the tungsten film 5a. With this structure, the resist can be certainly taken off by the ashing process and the process using a mixture solution of hydrogen peroxide solution and sulfuric acid, in the resist removing step carried out after forming the contact hole 11 in the first silicon nitride film 6. Further, since the tungsten nitride film 17 serving as a reaction inhibiting film is formed between the tungsten film 5a and the second tungsten silicide film 18, the reaction between these films 5a and 18 can be inhibited.

Figure 24:
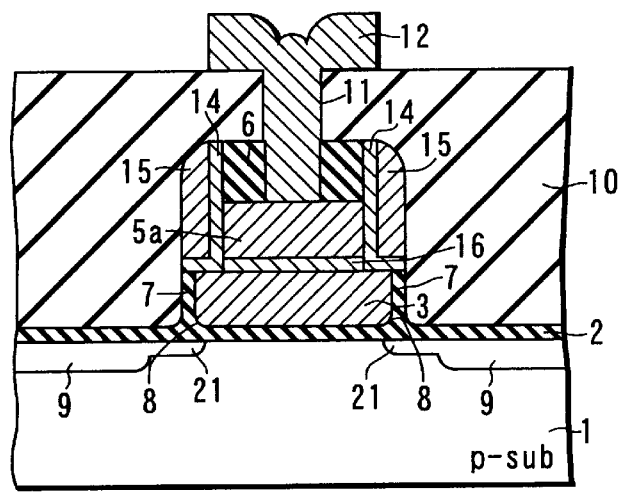
FIG. 24 is a cross sectional view illustrating the third embodiment of the present invention.

FIG. 24 illustrates the third embodiment of the present invention, and the same structural elements as those of the first embodiment are designated by the same reference numerals. In this paragraph, only the different sections will be described. The third embodiment is a case where the present invention is applied to a transistor having an LDD (lightly doped drain) structure. More specifically, an LDD region 21 is formed in the semiconductor substrate 1, so as to be adjacent to each side of the source/drain regions 9. The impurity concentration of each LDD region 21 is set lower than the impurity concentration of the source/drain regions 9. With the LDD region thus formed, the peak field intensity of the drain depletion layer, which is created in a pinch-off state, can be reduced even if the element is downsized, and therefore the reliability of the element can be enhanced.

Figure 25:
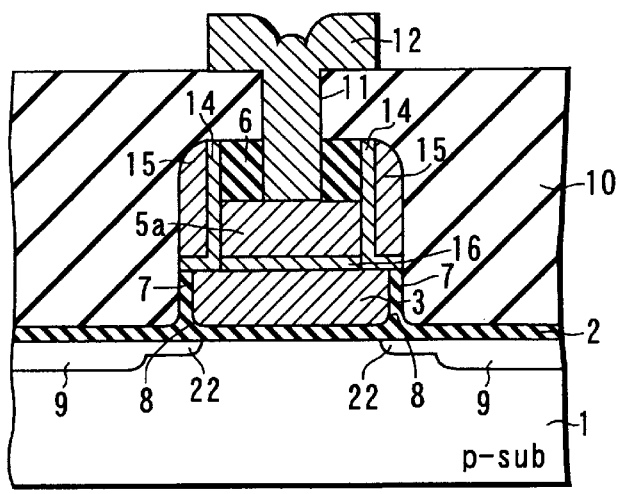
FIG. 25 is a cross sectional view illustrating the third embodiment of the present invention.

FIG. 25 illustrates the fourth embodiment of the present invention, and the same structural elements as those of the first embodiment are designated by the same reference numerals. In this paragraph, only the different sections will be described. The fourth embodiment is a case where the present invention is applied to a transistor having an extension structure. More specifically, an extension region 22 which is shallower than the source/drain regions 9 are formed in the semiconductor substrate 1, so as to be adjacent to each side of the source/drain regions 9. The impurity concentration of each extension region 22 is slightly lower than that of the source/drain regions 9, and slightly higher than that of the LDD region 21. That is, conditions for implanting arsenic ions to the source/drain regions 9 are an acceleration voltage of, e.g., 35 KeV, and a dosage of, e.g. $3 \times 10^{15}$ cm$^{-2}$, and conditions for implanting arsenic ions to the extension region 22 are an acceleration voltage of, e.g., 15 KeV, and a dosage of, e.g., $5 \times 10^{14}$ cm$^{-2}$. Further, conditions for implanting arsenic ions to the LDD region 21 are an acceleration voltage of, e.g., 15 KeV, and a dosage of, e.g., $5 \times 10^{13}$ cm$^{-2}$. As a result, the source/drain regions 9 have an impurity concentration of, e.g., $1 \times 10^{21}$ cm$^{-3}$, the extension region 2 has an impurity concentration of, e.g., $1 \times 10^{20}$ cm$^{-3}$, and the LDD region 21 has an impurity concentration of, e.g., $1 \times 10^{19}$ cm$^{-3}$. With the extension region 22 thus formed, the short channel effect can be suppressed even if the element is downsized, and therefore the margin for contact in the source/drain regions 9 can be maintained. Although they are not shown in FIGS. 24 and 25, side walls formed on a side surface of the gate structure are required to form source/drain regions 9 by the ion implantation.

In the first to fourth embodiments described above, the upper portion of the gate electrode is made of the tungsten film 5a; however the present invention is not limited to such a structure, but it is possible to use films of refractory metals such as molybdenum film and titanium film.

In the second embodiment, the second tungsten silicide film 18 is provided underneath the first silicon nitride film 6; however the present invention is not limited to such a structure, but the structure may be arbitrary as long as the tungsten film 5a can be protected from the hydrogen peroxide solution. Therefore, some other materials such as titanium silicide film and polysilicon film can be used in place of the tungsten silicide film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a gate insulating film deposited on a semiconductor substrate;

a polysilicon film serving as a lower portion of a gate electrode, provided on said gate insulating film;

a refractory metal film serving as an upper portion of the gate electrode, provided on the polysilicon film;

a silicon nitride film provided on the refractory metal film;

an oxidation inhibiting film made of a tungsten silicide film having a conductivity, wherein said oxidation inhibiting film is provided on a side surface of the refractory metal film; and a source region and a drain region provided in the semiconductor substrate.

2. A semiconductor device according to claim 1, wherein the refractory metal film is made of tungsten, molybdenum or titanium.

3. A semiconductor device according to claim 1, further comprising an LDD region provided in the semiconductor substrate, said source region and said drain region, wherein an impurity concentration of the LDD region is lower than that of said source region and said drain region.

4. A semiconductor device according to claim 1, further comprising an extension region provided in the semiconductor substrate, wherein said extension region is in contact with said source region and said drain region.

5. A semiconductor device comprising:

a gate insulating film deposited on a semiconductor substrate;

a polysilicon film serving as a lower portion of a gate electrode, provided on said gate insulating film;

a refractory metal film serving as an upper portion of the gate electrode, provided on the polysilicon film;

a silicon nitride film provided on the refractory metal film;

an oxidation inhibiting film made of a tungsten nitride film and a tungsten silicide film having a conductivity, wherein said oxidation inhibiting film is provided on a side surface of the refractory metal film; and a source region and a drain region provided in the semiconductor substrate.

6. A semiconductor device according to claim 5, wherein the refractory metal film is made of tungsten, molybdenum or titanium.

7. A semiconductor device according to claim 5, further comprising an LDD region provided in the semiconductor substrate, wherein said LDD region is in contact with said source region and said drain region, wherein an impurity concentration of the LDD region is lower than that of said source region and said drain region.

8. A semiconductor device according to claim 5, further comprising an extension region provided in the semiconductor substrate, wherein said extension region is in contact with said source region and said drain region.

* * * * *